United States Patent
Weiss

(10) Patent No.: US 7,260,494 B2
(45) Date of Patent: Aug. 21, 2007

(54) ECLIPZ WIRETEST FOR DIFFERENTIAL CLOCK/OSCILLATOR SIGNALS

(75) Inventor: Ulrich Weiss, Holzgerlingen (DE)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 11/055,829

(22) Filed: Feb. 11, 2005

(65) Prior Publication Data

US 2006/0195287 A1   Aug. 31, 2006

(51) Int. Cl.
*G01R 31/04* (2006.01)

(52) U.S. Cl. ............... 702/120; 327/136; 327/331; 327/25

(58) Field of Classification Search .......... 702/67, 702/69, 73, 117, 118, 119, 182, 183, 184, 702/185, 120; 331/2, 23, 25; 375/356; 327/20, 327/136

See application file for complete search history.

(56) References Cited

U.S. PATENT DOCUMENTS 4,692,932 A * 9/1987 Denhez et al. .............. 375/356
6,313,709 B1 * 11/2001 Nishimura et al. ........... 331/25

* cited by examiner

*Primary Examiner*—Bryan Bui
*Assistant Examiner*—Mohamed Charioui
(74) *Attorney, Agent, or Firm*—Duke W. Yee; Diana R. Gerhardt; Gerald H. Glanzman

(57) ABSTRACT

A method, apparatus, and computer program product in a data processing system for testing differential clock or oscillator signals. A method is comprised of the following steps: A first single-ended receiver is connected to a positive leg of a differential pair, and a second single-ended receiver is connected to a negative leg of the differential pair. An output of the first single-ended receiver is inverted and delayed before being input into a first RS Flip-Flop. An output of the second single-ended receiver is delayed before being input into a second RS Flip-Flop. An output of a differential receiver is inverted and input into the first and second RS Flip Flops as reset signals. Then a Wire OK signal is output indicating the condition of the legs of the differential pair.

20 Claims, 9 Drawing Sheets

ECLIPZ WIRETEST FOR DIFFERENTIAL CLOCK/OSCILLATOR SIGNALS

BACKGROUND OF THE INVENTION

1. Technical Field

The present invention relates generally to an improved data processing system and, in particular, to a method, apparatus, and computer program product for enhancing performance in a data processing system. Still more particularly, the present invention provides a method, apparatus, and computer program product for testing differential clock or oscillator signals in a data processing system.

2. Description of Related Art

A microprocessor is a silicon chip that contains a central processing unit (CPU) which controls all the other parts of a digital device. Designs vary widely but, in general, the CPU consists of a control unit, an arithmetic and logic unit (ALU) and memory (registers, cache, RAM and ROM) as well as various temporary buffers and other logic. The control unit fetches instructions from memory and decodes them to produce signals which control the other part of the computer. This may cause the control unit to transfer data between memory and ALU or to activate peripherals to perform input or output. A parallel computer has several CPUs which may share other resources such as memory and peripherals. In addition to bandwidth (the number of bits processed in a single instruction) and clock speed (how many instructions per second the microprocessor can execute), microprocessors are classified as being either RISC (reduced instruction set computer) or CISC (complex instruction set computer).

An oscillator clock is a circuit within a microprocessor that creates a series of pulses that pace the microprocessor's electronic system. The oscillator clock synchronizes, paces and coordinates the operations of the microprocessor's circuit. For differential signals, such as those used for oscillator distribution between oscillator generator circuits and user chips, to detect if one leg of a differential pair is broken is always a problem. Due to the nature of this differential signal, the function will still be partially available even with one leg broken.

One currently available technique to detect a broken leg of a differential pair is to add two single-ended receivers to the main differential receiver. One of these additional single-ended receivers is connected to the positive leg of the differential pair, and the other single-ended receiver is connected to the negative leg of the differential pair. The three output signals of the three receivers can then be observed by standard missing pulse detectors. The problem with this scheme is that standard missing pulse detectors need several cycles to detect a missing pulse, and in some situations the single-ended receiver is generating inverted signals, which cannot be detected by standard missing pulse generators.

Therefore, it would be advantageous to have an improved method, apparatus, and computer program product for detecting a broken leg of a differential pair. The wiretest system of the present invention tests differential clock or oscillator signals, and detects failures due to a broken leg within one cycle.

SUMMARY OF THE INVENTION

The present invention provides a method, apparatus, and computer program product in a data processing system for testing differential clock or oscillator signals. A method according to the invention is comprised of the following steps: A first single-ended receiver is connected to a positive leg of a differential pair, and a second single-ended receiver is connected to a negative leg of the differential pair. An output of the first single-ended receiver is inverted and delayed before being input into a first RS Flip-Flop. An output of the second single-ended receiver is delayed before being input into a second RS Flip-Flop. An output of a differential receiver is inverted and input into the first and second RS Flip Flops as reset signals. Then a Wire OK signal is output indicating the condition of the legs of the differential pair.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
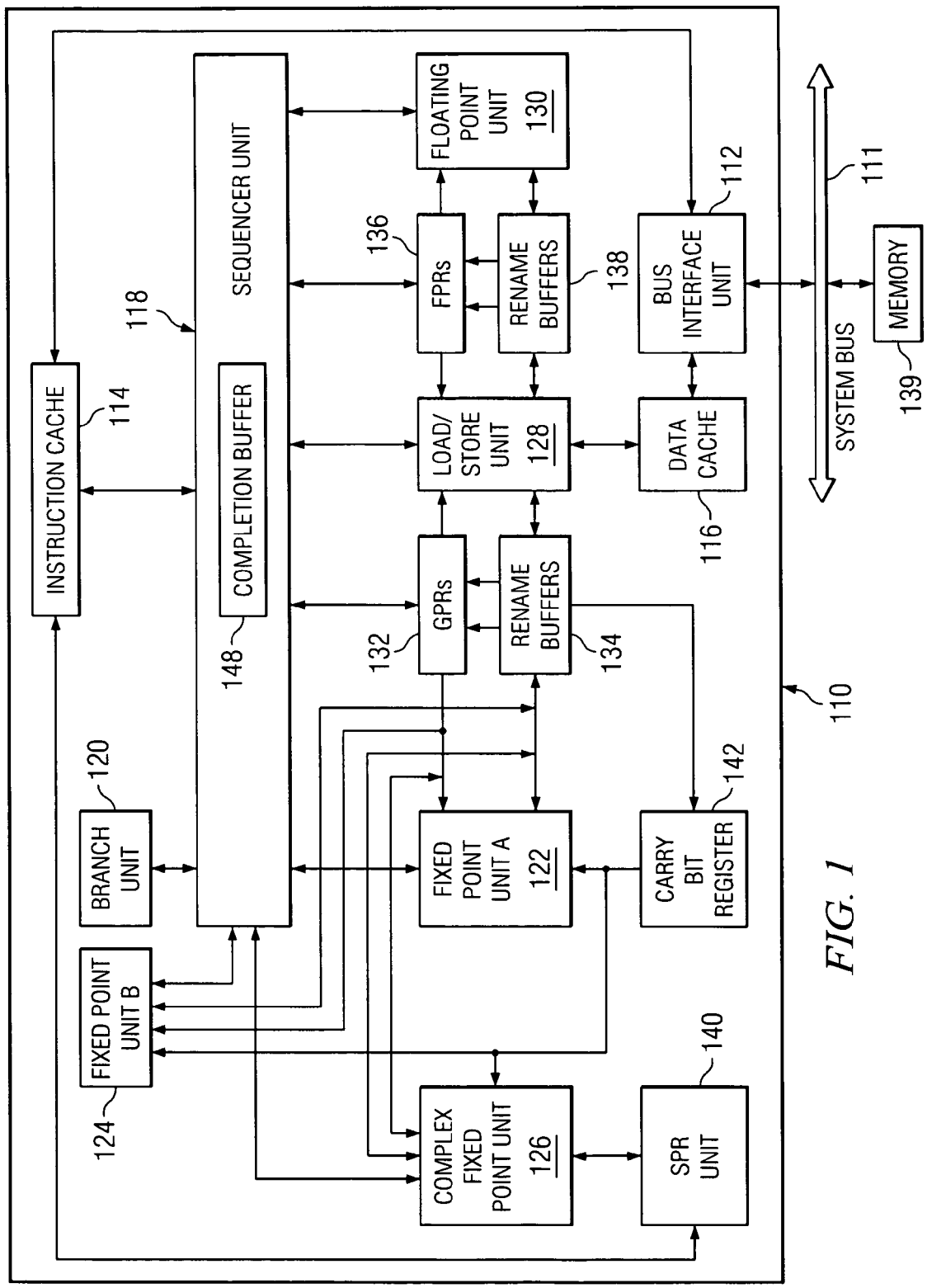
FIG. 1 is a block diagram of a processor system for processing information within which the present invention may be implemented according to a preferred embodiment of the present invention.

FIG. 1 is a block diagram of a processor system for processing information with which the present invention may be implemented in accordance with a preferred embodiment of the present invention. The processor is designated by reference number 110, and in the preferred embodiment, processor 110 is a single integrated circuit superscalar microprocessor. Accordingly, as discussed further herein below, processor 110 includes various units, registers, buffers, memories, and other sections, all of which are formed by integrated circuitry. Also, in the preferred embodiment, processor 110 operates according to reduced instruction set computer ("RISC") techniques. As shown in FIG. 1, a system bus 111 is connected to a bus interface unit ("BIU") 112 of processor 110. BIU 112 controls the transfer of information between processor 110 and system bus 111.

BIU 112 is connected to an instruction cache 114 and to a data cache 116 of processor 110. Instruction cache 114 outputs instructions to a sequencer unit 118. In response to such instructions from instruction cache 114, sequencer unit 118 selectively outputs instructions to other execution circuitry of processor 110.

In addition to sequencer unit 118, in the preferred embodiment, the execution circuitry of processor 110 includes multiple execution units, namely a branch unit 120, a fixed-point unit A ("FXUA") 122, a fixed-point unit B ("FXUB") 124, a complex fixed-point unit ("CFXU") 126, a load/store unit ("LSU") 128, and a floating-point unit ("FPU") 130. FXUA 122, FXUB 124, CFXU 126, and LSU 128 input their source operand information from general-purpose architectural registers ("GPRs") 132 and fixed-point rename buffers 134. Moreover, FXUA 122 and FXUB 124 input a "carry bit" from a carry bit ("CA") register 142. FXUA 122, FXUB 124, CFXU 126, and LSU 128 output results (destination operand information) of their operations for storage at selected entries in fixed-point rename buffers 134. Also, CFXU 126 inputs and outputs source operand information and destination operand information to and from special-purpose register processing unit ("SPR unit") 140.

FPU 130 inputs its source operand information from floating-point architectural registers ("FPRs") 136 and floating-point rename buffers 138. FPU 130 outputs results (destination operand information) of its operation for storage at selected entries in floating-point rename buffers 138.

In response to a Load instruction, LSU 128 inputs information from data cache 116 and copies such information to selected ones of rename buffers 134 and 138. If such information is not stored in data cache 116, then data cache 116 inputs (through BIU 112 and system bus 111) such information from a system memory 139 connected to system bus 111. Moreover, data cache 116 is able to output (through BIU 112 and system bus 111) information from data cache 116 to system memory 139 connected to system bus 111. In response to a Store instruction, LSU 128 inputs information from a selected one of GPRs 132 and FPRs 136 and copies such information to data cache 116.

Sequencer unit 118 inputs and outputs information to and from GPRs 132 and FPRs 136. From sequencer unit 118, branch unit 120 inputs instructions and signals indicating a present state of processor 110. In response to such instructions and signals, branch unit 120 outputs (to sequencer unit 118) signals indicating suitable memory addresses storing a sequence of instructions for execution by processor 110. In response to such signals from branch unit 120, sequencer unit 118 inputs the indicated sequence of instructions from instruction cache 114. If one or more of the sequence of instructions is not stored in instruction cache 114, then instruction cache 114 inputs (through BIU 112 and system bus 111) such instructions from system memory 139 connected to system bus 111.

In response to the instructions input from instruction cache 114, sequencer unit 118 selectively dispatches the instructions to selected ones of execution units 120, 122, 124, 126, 128, and 130. Each execution unit executes one or more instructions of a particular class of instructions. For example, FXUA 122 and FXUB 124 execute a first class of fixed-point mathematical operations on source operands, such as addition, subtraction, ANDing, ORing and XORing. CFXU 126 executes a second class of fixed-point operations on source operands, such as fixed-point multiplication and division. FPU 130 executes floating-point operations on source operands, such as floating-point multiplication and division.

As information is stored at a selected one of rename buffers 134, such information is associated with a storage location (e.g., one of GPRs 132 or CA register 142) as specified by the instruction for which the selected rename buffer is allocated. Information stored at a selected one of rename buffers 134 is copied to its associated one of GPRs 132 (or CA register 142) in response to signals from sequencer unit 118. Sequencer unit 118 directs such copying of information stored at a selected one of rename buffers 134 in response to "completing" the instruction that generated the information. Such copying is called "writeback."

As information is stored at a selected one of rename buffers 138, such information is associated with one of FPRs 136. Information stored at a selected one of rename buffers 138 is copied to its associated one of FPRs 136 in response to signals from sequencer unit 118. Sequencer unit 118 directs such copying of information stored at a selected one of rename buffers 138 in response to "completing" the instruction that generated the information.

Processor 110 achieves high performance by processing multiple instructions simultaneously at various ones of execution units 120, 122, 124, 126, 128, and 130. Accordingly, each instruction is processed as a sequence of stages, each being executable in parallel with stages of other instructions. Such a technique is called "pipelining." In a significant aspect of the illustrative embodiment, an instruction is normally processed as six stages, namely fetch, decode, dispatch, execute, completion, and writeback.

In the fetch stage, sequencer unit 118 selectively inputs (from instruction cache 114) one or more instructions from one or more memory addresses storing the sequence of instructions discussed further hereinabove in connection with branch unit 120, and sequencer unit 118.

In the decode stage, sequencer unit 118 decodes up to four fetched instructions.

In the dispatch stage, sequencer unit 118 selectively dispatches up to four decoded instructions to selected (in response to the decoding in the decode stage) ones of execution units 120, 122, 124, 126, 128, and 130 after reserving rename buffer entries for the dispatched instructions' results (destination operand information). In the dispatch stage, operand information is supplied to the selected execution units for dispatched instructions. Processor 110 dispatches instructions in order of their programmed sequence.

In the execute stage, execution units execute their dispatched instructions and output results (destination operand information) of their operations for storage at selected entries in rename buffers 134 and rename buffers 138 as discussed further hereinabove. In this manner, processor 110 is able to execute instructions out-of-order relative to their programmed sequence.

In the completion stage, sequencer unit 118 indicates an instruction is "complete." Processor 110 "completes" instructions in order of their programmed sequence.

In the writeback stage, sequencer unit 118 directs the copying of information from rename buffers 134 and 138 to GPRs 132 and FPRs 136, respectively. Sequencer unit 118 directs such copying of information stored at a selected rename buffer. Likewise, in the writeback stage of a particular instruction, processor 110 updates its architectural states in response to the particular instruction. Processor 110 processes the respective "writeback" stages of instructions in order of their programmed sequence. Processor 110 advantageously merges an instruction's completion stage and writeback stage in specified situations.

In the illustrative embodiment, each instruction requires one machine cycle to complete each of the stages of instruction processing. Nevertheless, some instructions (e.g., complex fixed-point instructions executed by CFXU 126) may require more than one cycle. Accordingly, a variable delay may occur between a particular instruction's execution and completion stages in response to the variation in time required for completion of preceding instructions.

A completion buffer 148 is provided within sequencer 118 to track the completion of the multiple instructions which are being executed within the execution units. Upon an indication that an instruction or a group of instructions have been completed successfully, in an application specified sequential order, completion buffer 148 may be utilized to initiate the transfer of the results of those completed instructions to the associated general-purpose registers.

The wiretest system of the present invention conducts an on-going wire test of a microprocessor's differential oscillator or clock distribution signal, which coordinates the functioning of microprocessor components as shown in FIG. 1, and detects failures due to a broken leg within one cycle. The wiretest system not only checks if the signals from the differential output and the single-ended receivers connected to the legs of the differential pair are oscillating, but also checks for the sequence of these three signals.

Figure 2:
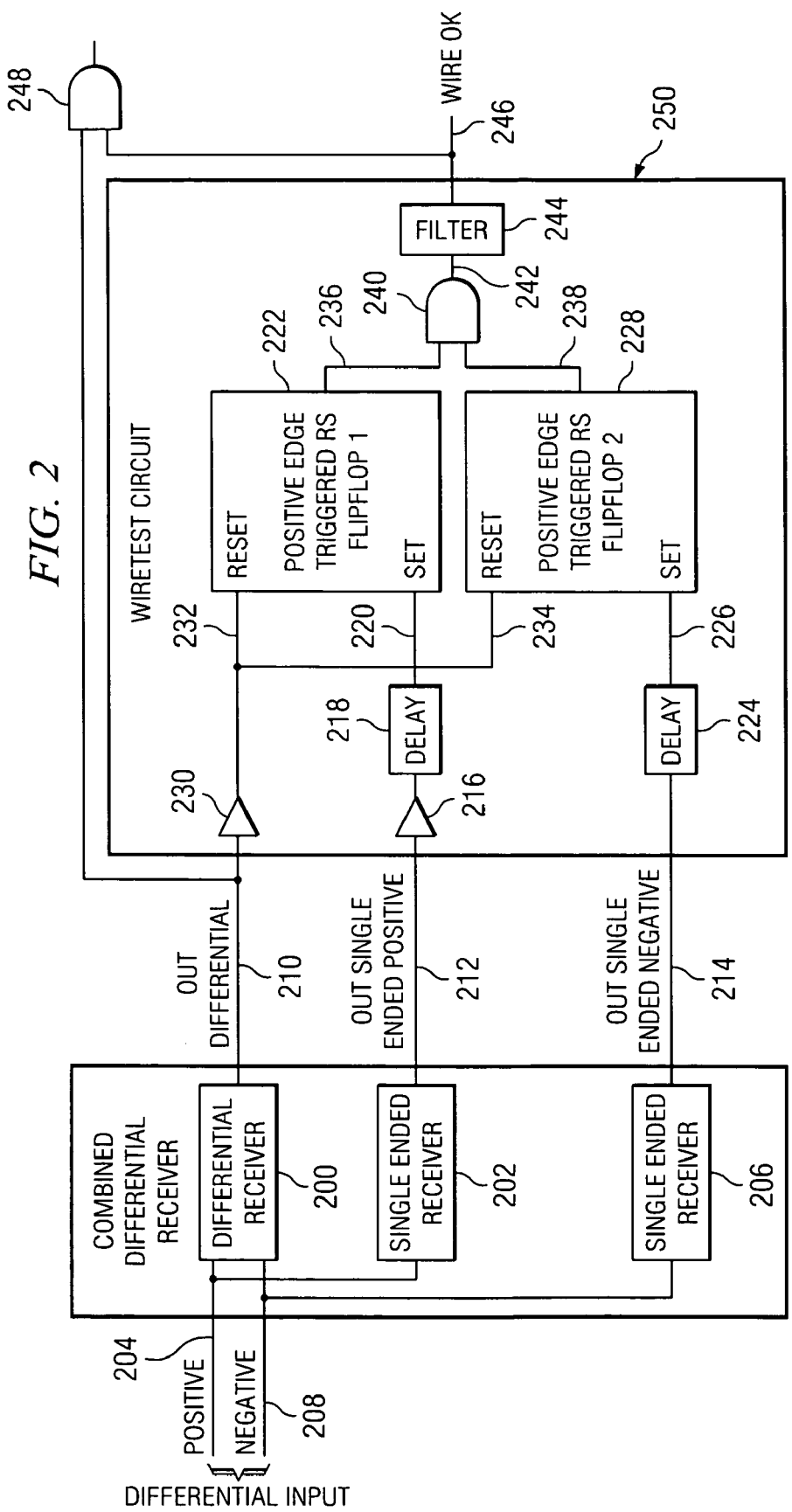
FIG. 2 is a block diagram of a wiretest system for differential signals, showing a wiretest circuit connected to a combined differential receiver in accordance with a preferred embodiment of the present invention.

FIG. 2 shows a diagram of wiretest circuit 250 in accordance with a preferred embodiment of the present invention connected to combined differential receiver 200, functioning as a wiretest for differential signals. One single-ended receiver 202 is connected to positive leg 204 of the differential pair, and another single-ended receiver 206 is connected to negative leg 208 of the differential pair. The input signals into the wiretest circuit of the present invention are output of the differential receiver 210, output of the single-ended receiver connected to the positive input to the differential receiver 212, and output of the single-ended receiver connected to the negative input to the differential receiver 214. Output of the single-ended receiver connected to the positive input to the differential receiver 212 is inverted by inverter 216 and delayed by delay mechanism 218 before the output is input 220 into RS Flip-Flop 1 222. Output of the single-ended receiver connected to the negative input to the differential receiver 214 is delayed by delay mechanism 224 before the output is input 226 into RS Flip-Flop 2 228. Output of the differential receiver 210 is inverted by inverter 230 and input into the first and second RS Flip Flops as reset signals 232, 234. Outputs of Flip-Flops 236, 238 are input into AND gate 240, and output of the AND gate 242 is fed through filter 244 to become Wire OK signal 246. Optionally, Wire OK signal 246 can be input into AND gate 248 along with output of the differential receiver 210. Wire OK signal 246 can also be used to delegate the output from the differential signal elsewhere, or used just as an error indicator.

Figure 3:
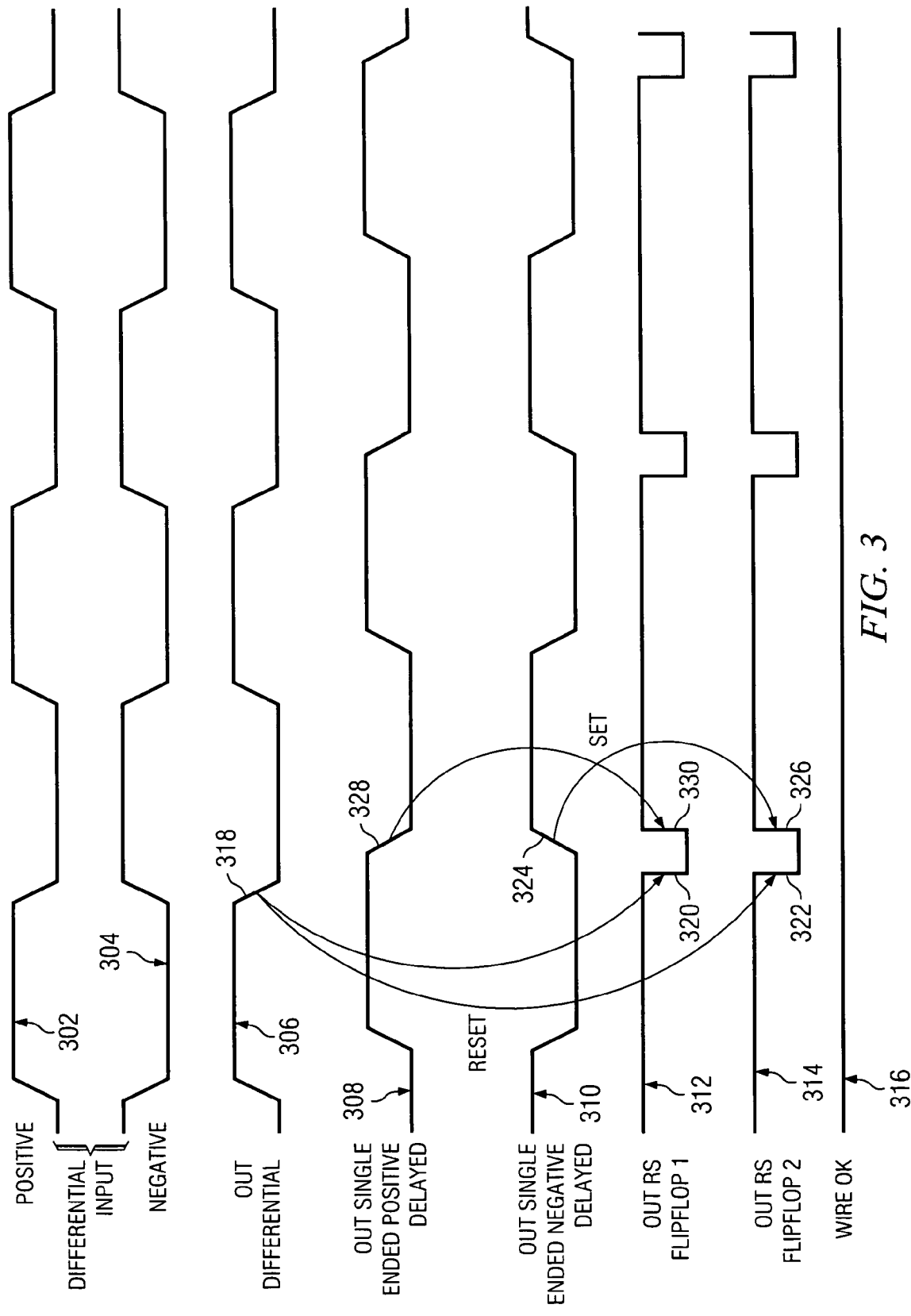
FIG. 3 is a diagram of wiretest system timing signals for a good case in accordance with a preferred embodiment of the present invention.

FIG. 3 shows, in accordance with a preferred embodiment of the present invention, a wiretest system's timing diagram for differential signals in a good case, when there is no broken leg for either the negative or positive input to the combined differential receiver. The timing diagram displays the signals for positive input to the combined differential receiver 302, negative input to the combined differential receiver 304, output from the combined differential receiver 306, delayed output from the single-ended receiver connected to the positive leg of the differential pair 308, delayed output from the single-ended receiver connected to the negative leg of the differential pair 310, output of RS Flip-Flop 1 312, output of RS Flip-Flop 2 314, and Wire OK signal 316.

Negative edge 318 (because the signal is actually inverted) of output from the combined differential receiver 306 resets 320 output of RS Flip-Flop 1 312 and also resets 322 output of RS Flip-Flop 2 314. Positive edge 324 of delayed output from the single-ended receiver connected to the negative leg of the differential pair 310 sets 326 output of RS Flip-Flop 2 314. Negative edge 328 (because the signal is actually inverted) of the delayed output from the single-ended receiver connected to the positive leg of the differential pair 308 sets 330 output of RS Flip-Flop 1 312. Output of RS Flip-Flop 1 312 and output of RS Flip-Flop 2 314 are only reset for the delay time specified for delayed output from the single-ended receiver connected to the positive leg of the differential pair 308 and delayed output from the single-ended receiver connected to the negative leg of the differential pair 310. Wire OK signal 316 stays set because the short delay time for the delayed outputs from the single-ended receivers is less than the filter delay time specified by the filter delay following the AND gate for the output of RS Flip-Flops. In contrast, Wire OK 316 signal does not stay set in a bad case.

Figure 4:
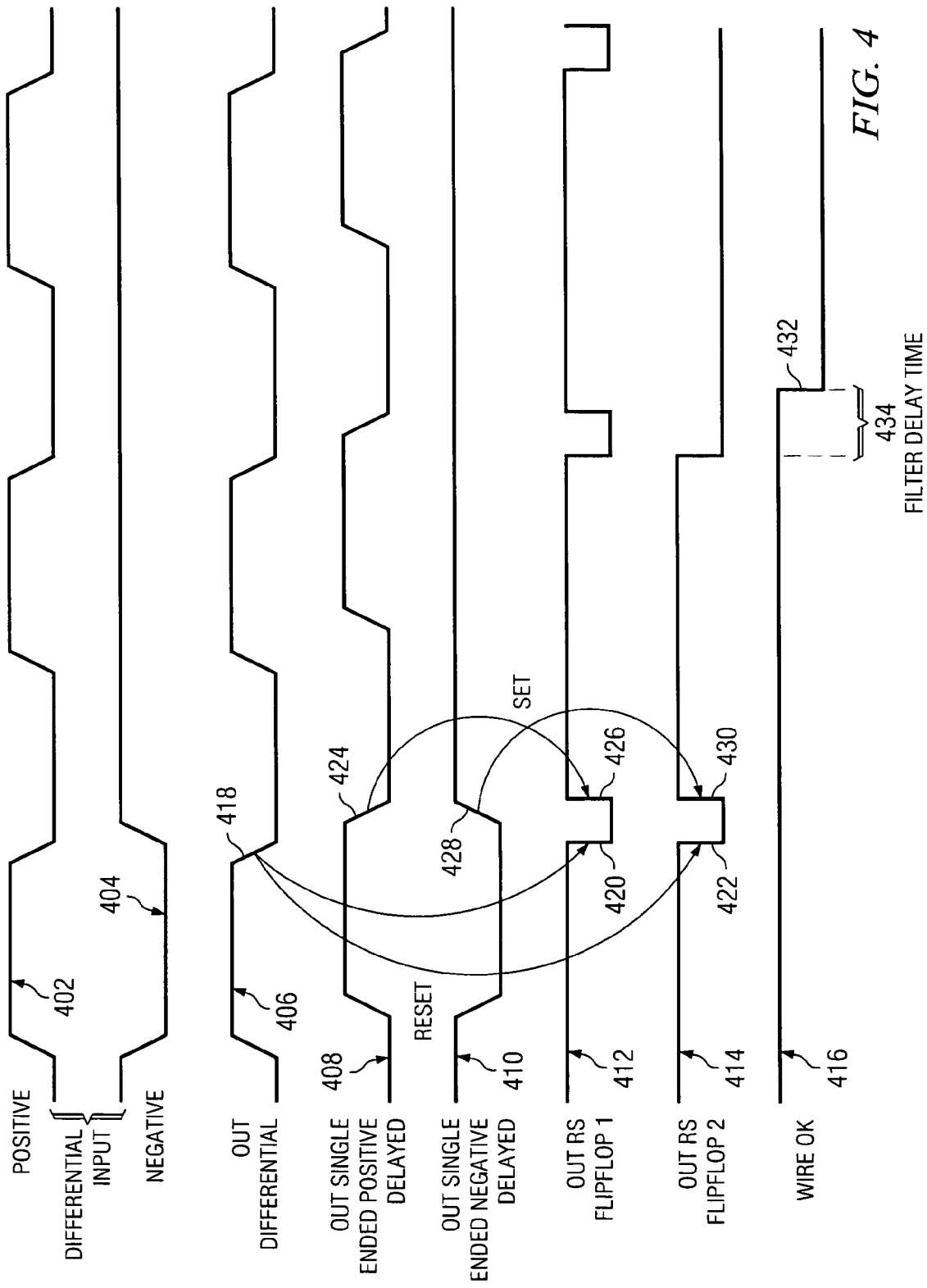
FIG. 4 is a diagram of wiretest system timing signals when the negative wire is broken at the receive side, in accordance with a preferred embodiment of the present invention.

FIG. 4 shows, in accordance with a preferred embodiment of the present invention, a wiretest system's timing diagram for differential signals in a bad case, when there is a broken leg at the receive side for the negative input to the combined differential receiver. The timing diagram displays the signals for positive input to the combined differential receiver 402, negative input to the combined differential receiver 404, output from the combined differential receiver 406, delayed output from the single-ended receiver connected to the positive leg of the differential pair 408, delayed output from the single-ended receiver connected to the negative leg of the differential pair 410, output of RS Flip-Flop 1 412, output of RS Flip-Flop 2 414, and Wire OK signal 416.

The negative edge 418 (the signal is actually inverted) of output from the combined differential receiver 406 resets 420 output of RS Flip-Flop 1 412 and also resets 422 output of RS Flip-Flop 2 414. Negative edge 424 (the signal is actually inverted) of delayed output from the single-ended receiver connected to the positive leg of the differential pair 408 sets 426 output of RS Flip-Flop 1 412. But after the negative wire is broken at the receive side, delayed output from the single-ended receiver connected to the negative leg of the differential pair 410 no longer has positive edge 428 to set 430 output of RS Flip-Flop 2 414. Sometimes when a wire is broken at the sending side of a transmission line, there is a signal with the same phase as the unbroken leg, but that is not the case in this example. Therefore, although output of RS Flip-Flop 1 412 is only reset for the delay time specified for delayed output from the single-ended receiver connected to the positive leg of the differential pair 408, output of RS Flip-Flop 2 414 stays reset. Wire OK signal 416 resets 432 because once the filter delay time 434 expires as specified by the filter delay following the AND gate for the output of RS Flip-Flops, the AND gate combines a set and a reset signal from the RS Flip-Flops to produce a reset signal, and the signal stays reset until the negative wire is no longer broken.

Figure 5:
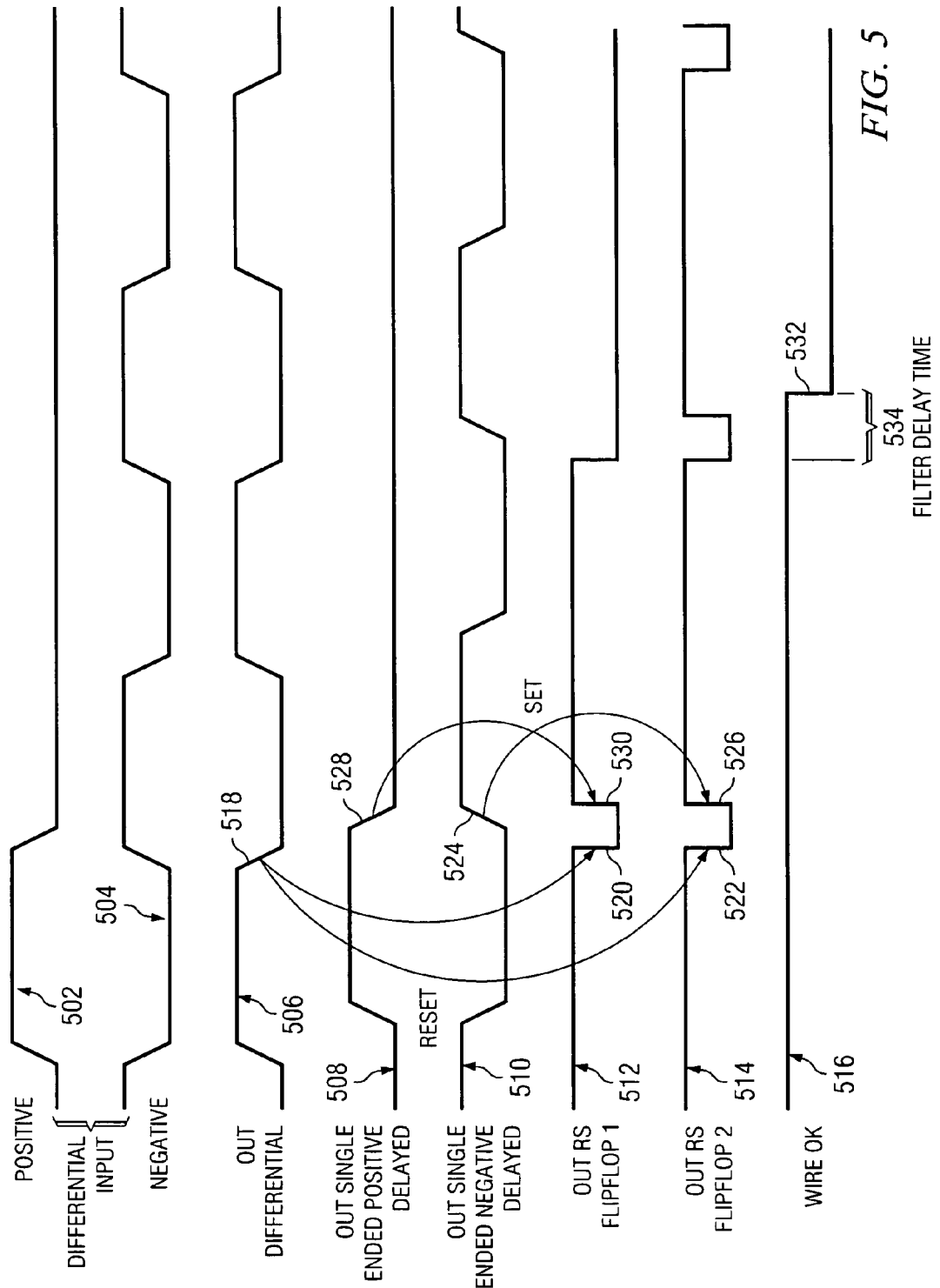
FIG. 5 is a diagram of wiretest system timing signals when the positive wire is broken at the receive side, in accordance with a preferred embodiment of the present invention.

FIG. 5 shows, in accordance with a preferred embodiment of the present invention, a wiretest system's timing diagram for differential signals in a bad case, when there is a broken leg at the receive side for the positive input to the combined differential receiver. The timing diagram displays the signals for positive input to the combined differential receiver 502, negative input to the combined differential receiver 504, output from the combined differential receiver 506, delayed output from the single-ended receiver connected to the positive leg of the differential pair 508, delayed output from the single-ended receiver connected to the negative leg of the differential pair 510, output of RS Flip-Flop 1 512, output of RS Flip-Flop 2 514, and Wire OK signal 516.

The negative edge 518 (the signal is actually inverted) of output from the combined differential receiver 506 resets 520 output of RS Flip-Flop 1 512 and also resets 522 output of RS Flip-Flop 2 514. The positive edge 524 of delayed output from the single-ended receiver connected to the negative leg of the differential pair 510 sets 526 output of RS Flip-Flop 2 514. But after the positive wire is broken at the receive side, delayed output from the single-ended receiver connected to the positive leg of the differential pair 508 no longer has negative edge 528 (the signal is actually inverted) to set 530 output of RS Flip-Flop 1 512. Sometimes when a wire is broken at the sending side of a transmission line, there is a signal with the same phase as the unbroken leg, but that is not the case in this example. Therefore, although output of RS Flip-Flop 2 514 is only reset for the delay time specified for delayed output from the single-ended receiver connected to the negative leg of the differential pair 510, output of RS Flip-Flop 1 512 stays reset. Wire OK signal 516 resets 532 because once the filter delay time 534 expires as specified by the filter delay following the AND gate for the output of RS Flip-Flops, the AND gate combines a set and a reset signal from the RS Flip-Flops to produce a reset signal, and the signal stays reset until the positive wire is no longer broken.

Figure 6:
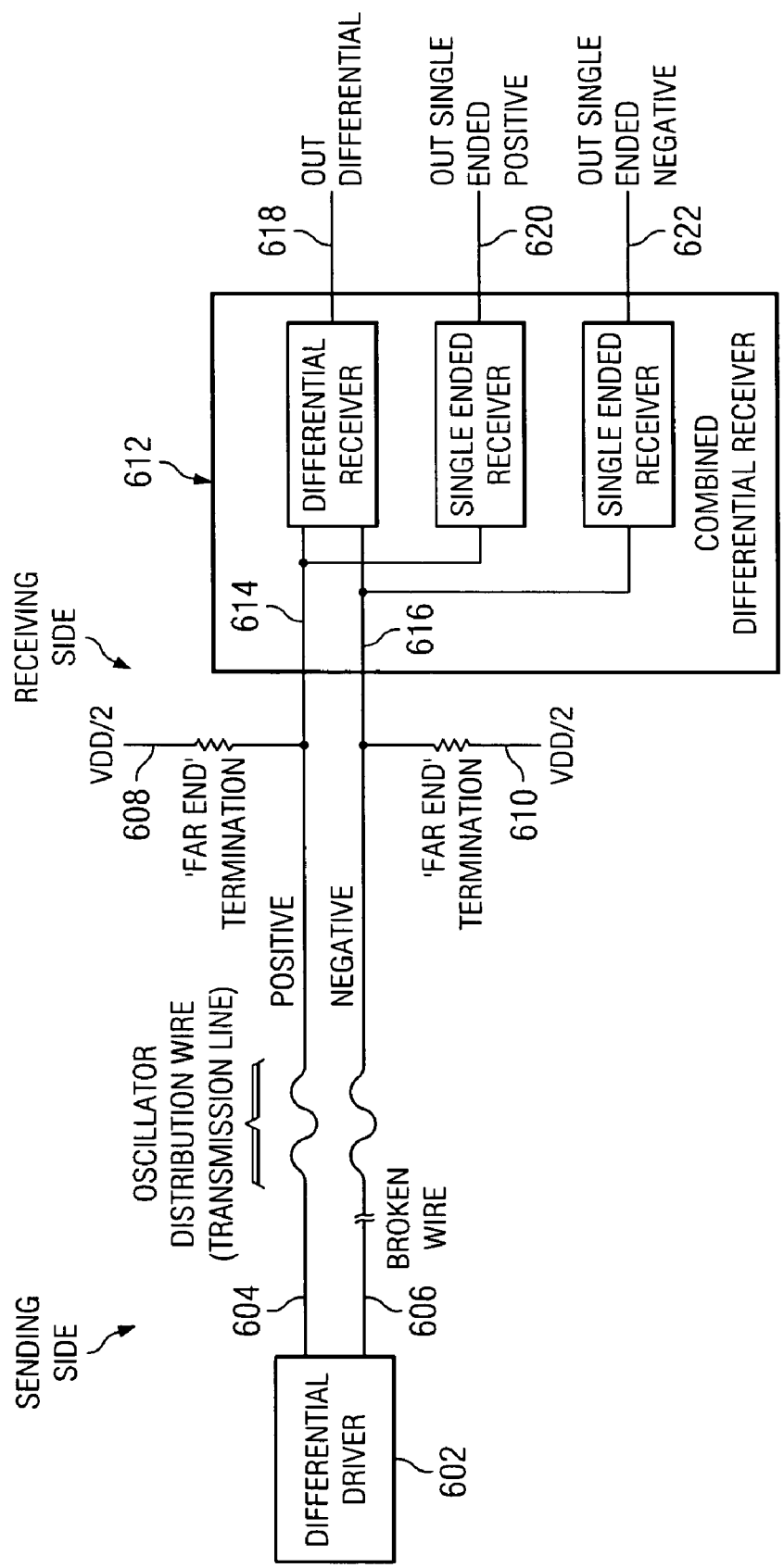
FIG. 6 is a diagram of a typical oscillator distribution scheme with a thevenin termination with outputs to a wiretest circuit in accordance with a preferred embodiment of the present invention.

FIG. 6 is a diagram of a typical oscillator distribution scheme with a thevenin termination, with outputs to a wiretest circuit in accordance with a preferred embodiment of the present invention. The diagram displays differential driver 602 at the sending side, positive leg of the oscillator distribution wire 604, negative leg of the oscillator distribution wire 606, resistor 608 for positive leg of the oscillator distribution wire 604 at the receiving side, resistor 610 for negative leg of the oscillator distribution wire 606 at the receiving side, combined differential receiver 612, positive input to the combined differential receiver 614, negative input to the combined differential receiver 616, output from the combined differential receiver 618, output from the single-ended receiver connected to the positive leg of the differential pair 620, and output from the single-ended receiver connected to the negative leg of the differential pair 622.

In a Thevenin termination, input 614 and input 616 to the combined differential receiver 612 are terminated at the end of transmission line 604 and transmission line 606, respectively, by resistor 608 and resistor 610, respectively, to VDD/2. Usually VDD/2 is a voltage that is exactly equal to or very close to the threshold voltage of the combined differential receiver 612. Therefore, this Thevenin termination scheme is very sensitive to noise, such as in the case of a broken leg. However, a problem exists for Thevenin terminations. Because transmission line 604 and transmission line 606 are quite long and have a capacitive coupling from one leg of the differential pair to the other, in case of a broken leg at the sending side of the transmission lines, the signals at the receiving side may be in phase for a Thevenin termination.

Figure 7:
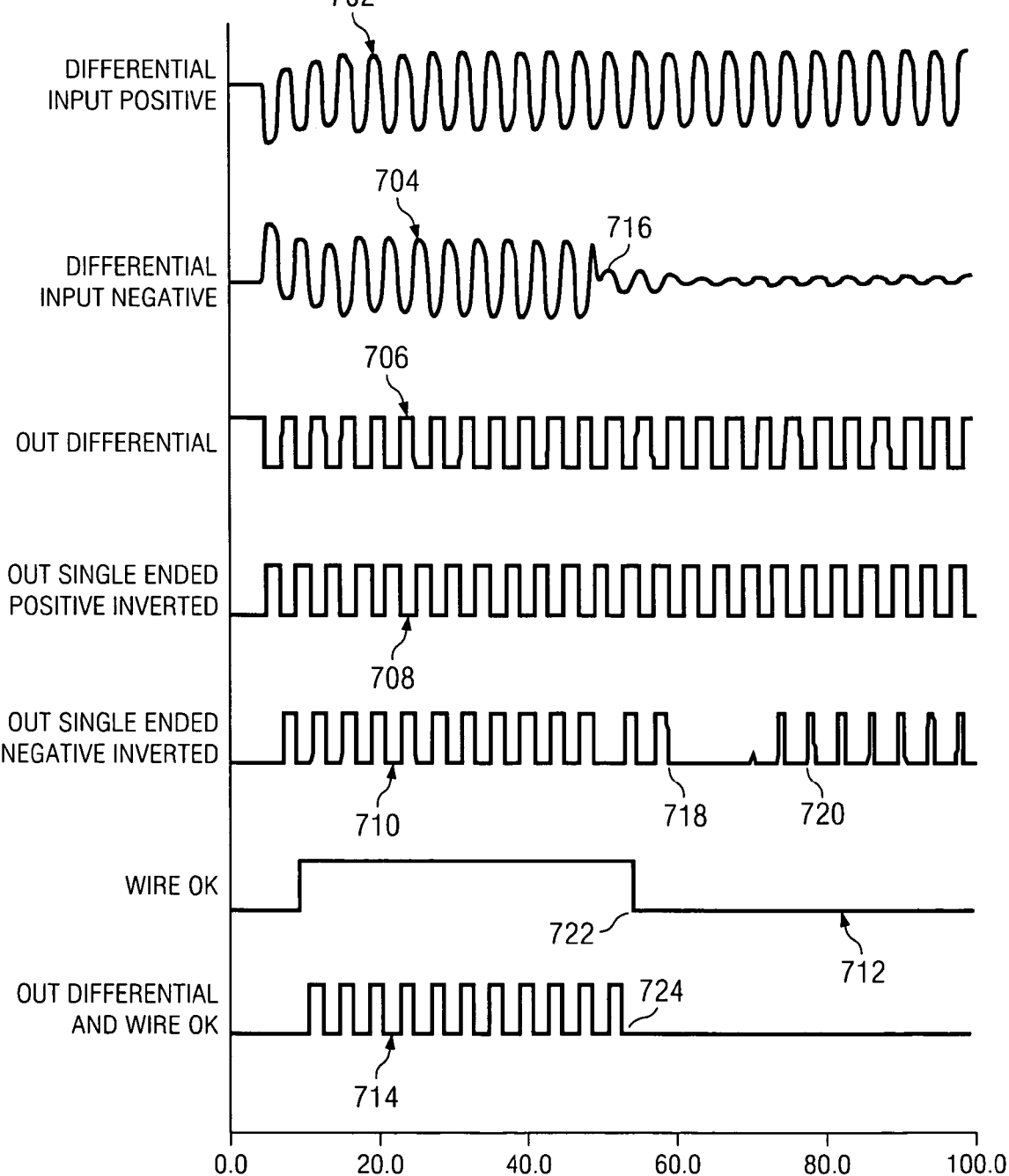
FIG. 7 is a diagram of wiretest system timing signals when the negative leg of the differential oscillator distribution wire is broken at the sending side, in accordance with a preferred embodiment of the present invention.

FIG. 7 shows, in accordance with a preferred embodiment of the present invention, a wiretest system's timing diagram for differential signals with a thevenin termination in a bad case, when there is a broken leg at the sending side for the negative input to the combined differential receiver. The timing diagram displays the signals for positive input to the combined differential receiver 702, negative input to the combined differential receiver 704, output from the combined differential receiver 706, output from the single-ended receiver connected to the positive leg of the differential pair 708, output from the single-ended receiver connected to the negative leg of the differential pair 710, Wire OK signal 712, and output from the combined differential receiver AND Wire OK signal 714.

When there is a broken leg at the sending side for the negative input to the combined differential receiver, negative input to the combined differential receiver 704 can have a signal that is inverted to the regular signal with reduced amplitude 716, as illustrated in this example, but output from the combined differential receiver 706 continues to toggle normally. Output from the single-ended receiver connected to the positive leg of the differential pair 708 also continues to toggle normally.

Output from the single-ended receiver connected to the negative leg of the differential pair 710 first drops 718, then toggles with the changed phase 720. The negative edge (the signal is actually inverted) of output from the combined differential receiver 706 resets the output of RS Flip-Flop 1 and also resets the output of RS Flip-Flop 2. The negative edge (the signal is actually inverted) of output from the single-ended receiver connected to the positive leg of the differential pair 708 sets the output of RS Flip-Flop 1. But shortly after the negative wire is broken, output from the single-ended receiver connected to the negative leg of the differential pair 710 no longer has the positive edge to set the output of RS Flip-Flop 2.

Because the transmission line is quite long and has a capacitive coupling from one leg of the differential pair to the other, in case of a broken leg at the sending side of the transmission line, the signals at the receiving side may be in phase, as illustrated in this example. After output from the single-ended receiver connected to the negative leg of the differential pair 710 drops 718, then the output toggles with the changed phase 720.

Because output from the single-ended receiver connected to the negative leg of the differential pair 710 becomes in phase with output from the single-ended receiver connected to the positive leg of the differential pair 708, output from the single-ended receiver connected to the negative leg of the differential pair 710 now has a positive edge to set output of RS Flip-Flop 2, but only after the filter delay time expires, as specified by the filter delay following the AND gate for the output of RS Flip-Flops. The set occurring after the filter delay time has expired results in the output of RS Flip-Flop 2 staying reset for too long. Wire OK signal 712 resets 722 because once the filter delay time expires as specified by the filter delay following the AND gate for the output of RS Flip-Flops, the AND gate combines a set and a reset signal from the RS Flip-Flops to produce a reset signal. Wire OK signal 712 stays reset until the negative wire is no longer broken. Because Wire OK signal 712 resets 722, output from the combined differential receiver AND Wire OK signal 714 also resets.

Figure 8:
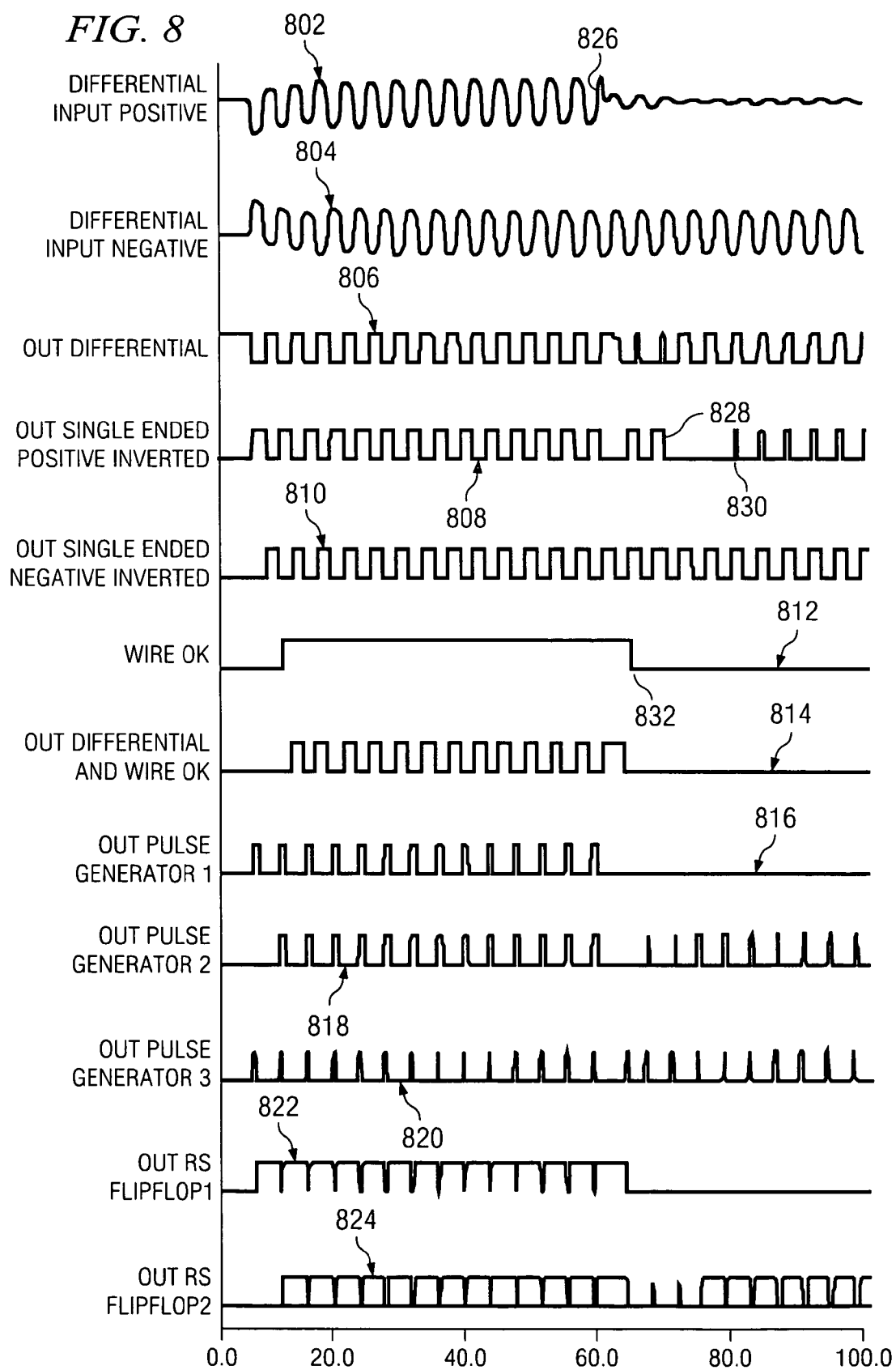
FIG. 8 is a diagram of wiretest system timing signals when the positive leg of the differential oscillator distribution wire is broken at the sending side, in accordance with a preferred embodiment of the present invention.

FIG. 8 shows, in accordance with a preferred embodiment of the present invention, a wiretest system's timing diagram for differential signals with a thevenin termination in a bad case, when there is a broken leg at the sending side for the positive input to the combined differential receiver. The timing diagram displays the signals for positive input to the combined differential receiver 802, negative input to the combined differential receiver 804, output from the combined differential receiver 806, output from the single-ended receiver connected to the positive leg of the differential pair 808, output from the single-ended receiver connected to the negative leg of the differential pair 810, Wire OK signal 812, output from the combined differential receiver AND Wire OK signal 814, output from Pulse Generation 1 816, output from Pulse Generation 2 818, output from Pulse Generation 3 820, output of RS Flip-Flop 1 822, and output of RS Flip-Flop 2 824.

When there is a broken leg at the sending side for the positive input to the combined differential receiver, positive input to the combined differential receiver 802 can have a signal that is inverted to the regular signal with reduced amplitude 826, as illustrated in this example, but output from the combined differential receiver 806 continues to toggle normally. Output from the single-ended receiver connected to the negative leg of the differential pair 810 also continues to toggle normally.

Output from the single-ended receiver connected to the positive leg of the differential pair 808 first drops 828, then toggles with the changed phase 830. The negative edge (the signal is actually inverted) of output from the combined differential receiver 806 resets the output of RS Flip-Flop 1 and also resets the output of RS Flip-Flop 2. The positive edge of output from the single-ended receiver connected to the negative leg of the differential pair 810 sets the output of RS Flip-Flop 2. But shortly after the positive wire is broken, output from the single-ended receiver connected to the positive leg of the differential pair 808 no longer has the negative edge (the signal is actually inverted) to set the output of RS Flip-Flop 1.

Because the transmission line is quite long and has a capacitive coupling from one leg of the differential pair to the other, in case of a broken leg at the sending side of the transmission line, the signals at the receiving side may be in phase, as illustrated in this example. After output from the single-ended receiver connected to the positive leg of the differential pair 808 drops 828, then the output toggles with the changed phase 830.

Because output from the single-ended receiver connected to the positive leg of the differential pair 808 becomes in phase with output from the single-ended receiver connected to the positive leg of the differential pair 810, output from the single-ended receiver connected to the negative leg of the differential pair 808 now has a positive edge to set output of RS Flip-Flop 2, but only after the filter delay time expires, as specified by the filter delay following the AND gate for the output of RS Flip-Flops. The set occurring after the filter delay time has expired results in the output of RS Flip-Flop 2 staying reset for too long. Wire OK signal 812 resets 832 because once the filter delay time expires as specified by the filter delay following the AND gate for the output of RS Flip-Flops, the AND gate combines a set and a reset signal from the RS Flip-Flops to produce a reset signal. Wire OK signal 812 stays reset until the positive wire is no longer broken. Because Wire OK signal 812 resets 832, output from the combined differential receiver AND Wire OK signal 814 also resets.

Figure 9:
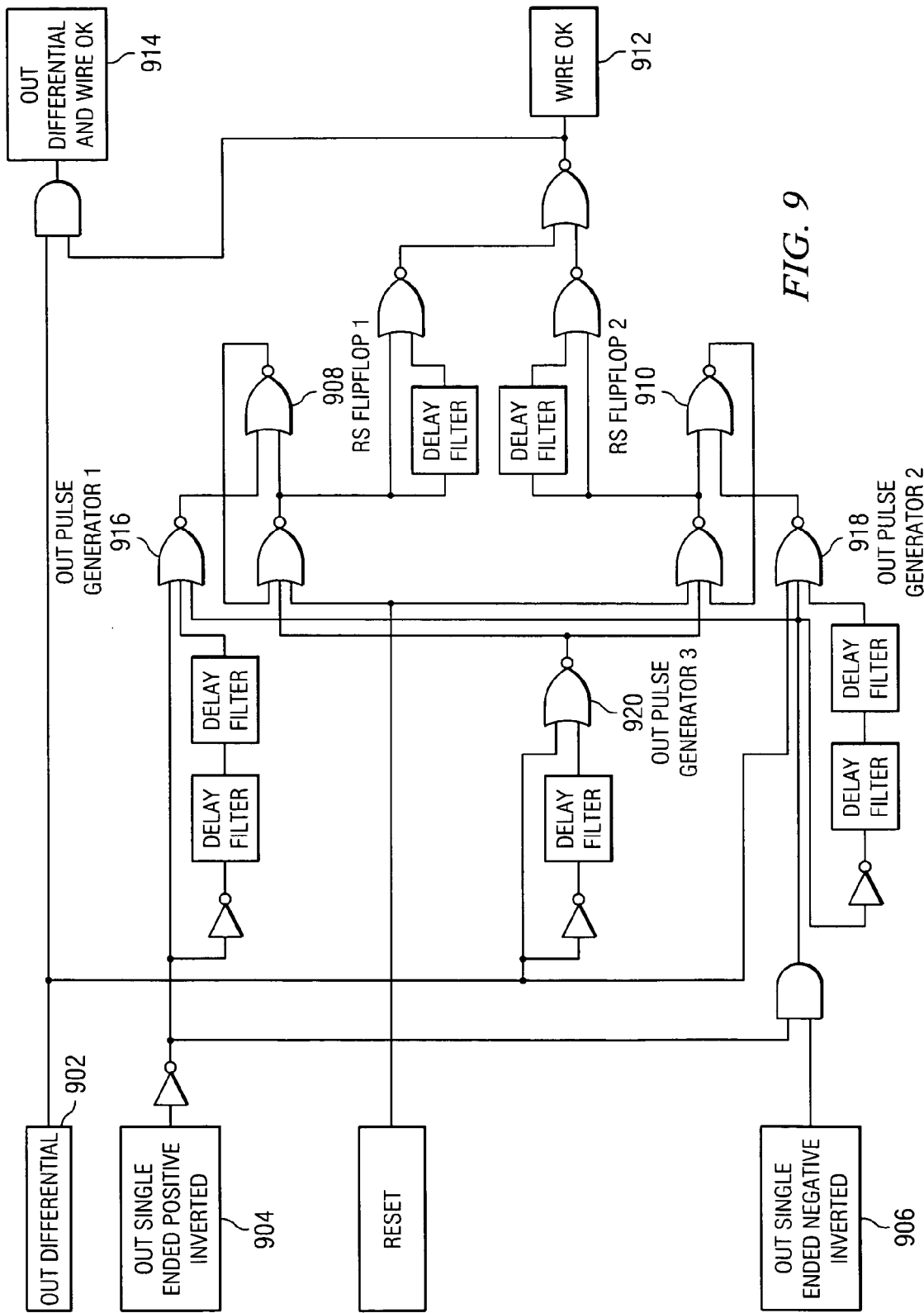
FIG. 9 is a schematic diagram of an example of a wiretest system in accordance with a preferred embodiment of the present invention.

FIG. 9 shows a schematic diagram of a wiretest system in accordance with a preferred embodiment of the present invention. The schematic diagram displays output from the combined differential receiver 902, output from the single-ended receiver connected to the positive leg of the differential pair 904, output from the single-ended receiver connected to the negative leg of the differential pair 906, output of RS Flip-Flop 1 908, output of RS Flip-Flop 2 910, Wire OK signal 912, output from the combined differential receiver AND Wire OK signal 914, output from Pulse Generation 1 916, output from Pulse Generation 2 918, and output from Pulse Generation 3 920.

The wiretest system of the present invention tests differential oscillator or clock distribution signals, and detects failures due to a broken leg within one cycle, whether the broken leg results in the loss of a signal or whether the broken leg, as in the case of a thevenin termination scheme, results in a reduced-amplitude signal that is in-phase with the unbroken leg.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method in a data processing system for providing a signal indicating a condition of legs of a differential pair, the method comprising:
   connecting a first single-ended receiver to a positive leg of a differential pair, and a second single-ended receiver to a negative leg of a differential pair;
   inverting and delaying an output of the first single-ended receiver before the output is input into a first RS Flip-Flop;
   delaying an output of the second single-ended receiver before the output is input into a second RS Flip-Flop;
   inverting an output of a differential receiver and inputting the output into the first and second RS Flip Flops as reset signals; and
   outputting a Wire OK signal indicating a condition of the legs of the differential pair.

2. The method of claim 1 further comprising:
   inputting outputs of the first RS Flip-Flop and the second RS Flip-Flop into an AND gate; and feeding an output of the AND gate into a filter, wherein the filter delays the output of the AND gate, and wherein the delayed output of the AND gate is the Wire OK signal.

3. The method of claim 2, wherein:
the first RS Flip-Flop and the second RS Flip-Flop are positive edge triggered Flip-Flops.

4. The method of claim 3, wherein:
a negative edge of the inverted output from the differential receiver resets the output of the first RS Flip-Flop and also resets the output of the second RS Flip-Flop;
a positive edge of the delayed output from the second single-ended receiver sets the output of the second RS Flip-Flop; and
a negative edge of the inverted and delayed output from the first single-ended receiver sets the output of the first RS Flip-Flop;
wherein when one of the positive leg or the negative leg of the differential pair is broken, the output of one of the first RS Flip-Flop or the second RS Flip-Flop, respectively, stays reset for more than a delay time for the filter delay, wherein the Wire OK signal resets.

5. The method of claim 3, wherein:
a negative edge of the inverted output from the differential receiver resets the output of the first RS Flip-Flop and also resets the output of the second RS Flip-Flop;
a positive edge of the delayed output from the second single-ended receiver sets the output of the second RS Flip-Flop; and
a negative edge of the inverted and delayed output from the first single-ended receiver sets the output of the first RS Flip-Flop;
wherein when one of the positive leg or the negative leg of the differential pair is broken, the leg that is broken has an input to the differential receiver with reduced amplitude and inverted to a regular signal, wherein the output of one of the first RS Flip-Flop or the second RS Flip-Flop, respectively, sets with a resetting for the other one of the first RS Flip-Flop or the second RS Flip-Flop, respectively, and wherein the Wire OK signal resets.

6. The method of claim 2 further comprising:
inputting the Wire Ok signal and the output of the differential receiver into a second AND gate.

7. The method of claim 1, wherein:
the delayed output of the first single-ended receiver is not inverted before the output is input into a first RS Flip-Flop;
the delayed output of the second single-ended receiver is inverted before the output is input into a second RS Flip-Flop; and
the output of the differential receiver is not inverted before inputting the output into the first and second RS Flip Flops as reset signals.

8. The method of claim 1, wherein:
the inverted output of the first single-ended receiver is not delayed before the output is input into a first RS Flip-Flop;
the output of the second single-ended receiver is not delayed before the output is input into a second RS Flip-Flop; and
the inverted output of the differential receiver is delayed before inputting the output into the first and second RS Flip Flops as reset signals.

9. An apparatus in a data processing system for providing a signal indicating a condition of legs of a differential pair, the apparatus comprising:

a first single-ended receiver connected to a positive leg of a differential pair, and a second single-ended receiver connected to a negative leg of a differential pair;
inverter and delay mechanism for inverting and delaying an output of the first single-ended receiver before the output is input into a first RS Flip-Flop;
a delay mechanism for delaying an output of the second single-ended receiver before the output is input into a second RS Flip-Flop;
an inverter for inverting an output of a differential receiver, and inputting the output into the first and second RS Flip Flops as reset signals; and
outputting means for outputting a Wire OK signal indicating a condition of the legs of the differential pair.

10. The apparatus of claim 9 further comprising:
inputting means for inputting outputs of the first RS Flip-Flop and the second RS Flip-Flop into an AND gate; and
feeding means for feeding an output of the AND gate into a filter, wherein the filter delays the output of the ANT) gate, and wherein the delayed output of the AND gate is the Wire OK signal.

11. The apparatus of claim 10 wherein:
the first RS Flip-Flop and the second RS Flip-Flop are positive edge triggered Flip-Flops.

12. The apparatus of claim 11, wherein:
a negative edge of the inverted output from the differential receiver resets the output of the first RS Flip-Flop and also resets the output of the second RS Flip-Flop;
a positive edge of the delayed output from the second single-ended receiver sets the output of the second RS Flip-Flop; and
a negative edge of the inverted and delayed output from the first single-ended receiver sets the output of the first RS Flip-Flop;
wherein when one of the positive leg or the negative leg of the differential pair is broken, the output of one of the first RS Flip-Flop or the second RS Flip-Flop, respectively, stays reset for more than a delay time for the filter delay, wherein the Wire OK signal resets.

13. The apparatus of claim 11, wherein:
a negative edge of the inverted output from the differential receiver resets the output of the first RS Flip-Flop and also resets the output of the second RS Flip-Flop;
a positive edge of the delayed output from the second single-ended receiver sets the output of the second RS Flip-Flop; and
a negative edge of the inverted and delayed output from the first single-ended receiver sets the output of the first RS Flip-Flop;
wherein when one of the positive leg or the negative leg of the differential pair is broken, the leg that is broken has an input to the differential receiver with reduced amplitude and inverted to a regular signal, wherein the output of the first RS Flip-Flop or the second RS Flip-Flop, respectively, sets with a resetting for the other of the first RS Flip-Flop or the second RS Flip-Flop, respectively, wherein the Wire OK signal resets.

14. The apparatus of claim 10 further comprising:
inputting means for inputting the Wire Ok signal and the output of the differential receiver into a second AND gate.

15. A computer-readable medium having computer readable program code for use in a data processing system for providing a signal indicating a condition of legs of a differential pair, the computer readable program code comprising:

first instructions for connecting a first single-ended receiver to a positive leg of a differential pair, and a second single-ended receiver to a negative leg of a differential pair;

second instructions for inverting and delaying an output of the first single-ended receiver before the output is input into a first RS Flip-Flop;

third instructions for delaying an output of the second single-ended receiver before the output is input into a second RS Flip-Flop;

fourth instructions for inverting an output of a differential receiver and inputting the output into the first and second RS Flip Flops as reset signals; and fifth instructions for outputting a Wire OK signal indicating a condition of the legs of the differential pair.

16. The computer-readable medium of claim 15 further comprising:

sixth instructions for inputting outputs of the first RS Flip-Flop and the second RS Flip-Flop into an AND gate; and seventh instructions for feeding an output of the AND gate into a filter, wherein the filter delays the output of the AND gate, and wherein the delayed output of the AND gate is the Wire OK signal.

17. The computer-readable medium of claim 16 wherein: the first RS Flip-Flop and the second RS Flip-Flop are positive edge triggered Flip-Flops.

18. The computer-readable medium of claim 17, wherein:

a negative edge of the inverted output from the differential receiver resets the output of the first RS Flip-Flop and also resets the output of the second RS Flip-Flop;

a positive edge of the delayed output from the second single-ended receiver sets the output of the second RS Flip-Flop; and a negative edge of the inverted and delayed output from the first single-ended receiver sets the output of the first RS Flip-Flop;

wherein when one of the positive leg or the negative leg of the differential pair is broken, the output of one of the first RS Flip-Flop or the second RS Flip-Flop, respectively, stays reset for more than a delay time for the filter delay, wherein the Wire OK signal resets.

19. The computer-readable medium of claim 17, wherein:

a negative edge of the inverted output from the differential receiver resets the output of the first RS Flip-Flop and also resets the output of the second RS Flip-Flop;

a positive edge of the delayed output from the second single-ended receiver sets the output of the second RS Flip-Flop; and a negative edge of the inverted and delayed output from the first single-ended receiver sets the output of the first RS Flip-Flop;

wherein when one of the positive leg or the negative leg of the differential pair is broken, the leg that is broken has an input to the differential receiver with reduced amplitude and inverted to a regular signal, wherein the output of one of the first RS Flip-Flop or the second RS Flip-Flop, respectively, sets with a resetting for the other of the first RS Flip-Flop or the second RS Flip-Flop, respectively, wherein the Wire OK signal resets.

20. The computer-readable medium of claim 16 further comprising:

eighth instructions for inputting the Wire Ok signal and the output of the differential receiver into a second AND gate.

* * * * *